(12) United States Patent
Chan et al.

(10) Patent No.: US 10,634,929 B2
(45) Date of Patent: Apr. 28, 2020

(54) OPTICAL DRIVING MECHANISM

(71) Applicant: TDK TAIWAN CORP., Taoyuan (TW)

(72) Inventors: Yi-Liang Chan, Taoyuan (TW);
Fu-Yuan Wu, Taoyuan (TW);
Chin-Ming Hu, Taoyuan (TW); Ichitai Moto, Taoyuan (TW); Sin-Jhong Song, Taoyuan (TW)

(73) Assignee: TDK Taiwan Corp., Taoyuan (TW)

( * ) Notice: Subject to any disclaimer, the term of this patent is extended or adjusted under 35 U.S.C. 154(b) by 52 days.

(21) Appl. No.: 16/129,041

(22) Filed: Sep. 12, 2018

(65) Prior Publication Data

US 2019/0121157 A1 Apr. 25, 2019

Related U.S. Application Data

(60) Provisional application No. 62/574,390, filed on Oct. 19, 2017.

(30) Foreign Application Priority Data

Aug. 1, 2018 (CN) .......................... 2018 1 0862984

(51) Int. Cl.
| | |
|---|---|
| *G02B 7/04* | (2006.01) |
| *G02B 27/64* | (2006.01) |
| *G03B 5/04* | (2006.01) |
| *G02B 7/02* | (2006.01) |
| *H02K 41/035* | (2006.01) |
| *G01D 5/14* | (2006.01) |
| *G02B 7/08* | (2006.01) |

(Continued)

(52) U.S. Cl.
CPC .......... *G02B 27/646* (2013.01); *G01D 5/145* (2013.01); *G02B 7/028* (2013.01); *G02B 7/08* (2013.01); *G03B 5/04* (2013.01); *H02K 41/0354* (2013.01); *H02K 41/0356* (2013.01); *G03B 2205/0015* (2013.01); *G03B 2205/0069* (2013.01); *H05K 1/181* (2013.01); *H05K 5/0247* (2013.01); *H05K 5/04* (2013.01); *H05K 2201/1003* (2013.01); *H05K 2201/10121* (2013.01); *H05K 2201/10151* (2013.01)

(58) Field of Classification Search
CPC .......... G02B 7/09; G02B 7/08; G02B 27/646; G02B 7/10
See application file for complete search history.

(56) References Cited

U.S. PATENT DOCUMENTS

2016/0258425 A1* 9/2016 Ladwig ................ G02B 27/646

* cited by examiner

*Primary Examiner* — Joseph P Martinez

(74) *Attorney, Agent, or Firm* — Muncy, Geissler, Olds & Lowe, P.C.

(57) ABSTRACT

A lens driving module is provided, configured to drive an optical element, including a holder, a circuit board assembly, a base module, and a magnetic element. The optical element is disposed in the holder, and the circuit board assembly has a driving coil. The base module has a metal substrate, an insulating layer, a circuit layer electrically connected with the driving coil, and a protective layer. The metal substrate has a bent portion where an opening is formed on. A wire of the circuit layer extends across the opening and forms a bridging portion. The protective layer has a protruding portion extending over the opening and covers the bridging portion. The magnetic element is coupled to the driving coil, and the two are configured to drive the optical element to move relative to the base module.

17 Claims, 14 Drawing Sheets

(51) Int. Cl.
*H05K 1/18* (2006.01)
*H05K 5/04* (2006.01)
*H05K 5/02* (2006.01)

OPTICAL DRIVING MECHANISM

CROSS REFERENCE TO RELATED APPLICATIONS

This application claims the benefit of U.S. Provisional Application No. 62/574,390, filed on Oct. 19, 2017, and China Patent Application No. 201810862984.2, filed on Aug. 1, 2018, the entirety of which is incorporated by reference herein.

BACKGROUND OF THE INVENTION

Field of the Invention

The application relates in general to an optical driving mechanism, and in particular to an optical driving mechanism that includes a circuit board assembly having a driving coil and a base module.

Description of the Related Art

Thanks to ongoing technological developments, recent electronic devices (such as tablet computers and smartphones) usually include a lens module capable of aiding in photography or recording video, or are even equipped with dual lens modules, bringing users a wealth of visual enjoyment. However, an image may come out blurry if the user shakes the lens module in the electronic device when using it. To improve image quality, it is increasingly important to design an effectively shockproof lens module. In addition, people are currently pursuing miniaturization of devices, and it is expected that electronic products will be smaller and lighter. Reducing the size of an electronic product can be implemented by, for example, reducing the occupying volume of the internal electronic components (such as optical driving mechanisms, sensors, displays, antennas, etc.). Therefore, how to reduce the occupied space through a special configuration design is an important issue.

BRIEF SUMMARY OF INVENTION

To address the deficiencies of conventional products, an embodiment of the invention provides a lens driving mechanism, configured to drive an optical element, including a holder, a circuit board assembly, a base module, and a magnetic element. The optical element is disposed on a holder, and the circuit board assembly has a driving coil. The base module has a metal substrate, an insulating layer, a circuit layer electrically connected with the driving coil, and a protective layer. The insulating layer is disposed between the metal substrate and the circuit layer, and the circuit layer is disposed between the insulating layer and the protective layer. The metal substrate has a bent portion, and an opening is formed on the bent portion. A wire of the circuit layer extends across the opening and forms a bridging portion. The protective layer has a protruding portion which extends over the opening and covers the bridging portion. The magnetic element is coupled to the driving coil. The magnetic element and the driving coil are configured to drive the holder and the optical element to move relative to the base module.

In some embodiments, the bent portion of the metal substrate is not covered by the bridging portion of the circuit layer and the protruding portion of the protective layer, and an inner surface of the bent portion has a recess, wherein the base module further has a glue disposed in the recess. In the direction of the optical axis of the optical element, the insulating layer is closer to the metal substrate than the protective layer, and the thermal conductivity of the protective layer is lower than the thermal conductivity of the insulating layer.

In some embodiments, the circuit layer has an electrical contact exposed to an opening of the protective layer and electrically connected to the circuit board assembly, and the area of the opening is larger than the area of the electrical contact exposed by the opening. The lens driving mechanism further comprises a metal housing, wherein the metal housing and the metal substrate are combined with each other by welding and adhesive, and the metal housing forms a closed joint surface with the metal substrate. The lens driving mechanism further comprises an elastic member connecting the circuit board assembly and the holder, wherein the elastic member passes through the circuit board assembly and is soldered to the bottom surface of the circuit board assembly. The circuit board assembly further has a circuit structure electrically isolated from the driving coil, and the elastic member is electrically connected to the circuit structure, and the circuit structure is electrically connected to the circuit layer of the base module.

In some embodiments, the lens driving mechanism further comprises an elastic member connecting the base module and the holder, wherein the elastic member passes through the metal substrate and is soldered to the bottom surface of the metal substrate. The metal substrate includes a main body and a connection piece. There is a gap between the main body and the connection piece. The main body and the connection piece are electrically isolated from each other. The elastic member passes through the connection piece and is soldered to the bottom surface of the connection piece. The lens driving mechanism further comprises an elastic member and a hollow electrical connecting element. The circuit board assembly further has a circuit structure that is electrically isolated from the driving coil. The elastic member connects the circuit board assembly and the holder. The electrical connecting element is affixed to the bottom surface of the circuit board assembly and is electrically connected to the circuit structure. The elastic component passes through the electrical connecting element and is soldered to the bottom of the electrical connecting element. The circuit board assembly further has a circuit structure that is electrically isolated from the driving coil and electrically connected to the circuit layer. In the direction of the optical axis of the optical element, the circuit structure and the driving coil are located in different positions in the circuit board assembly.

In some embodiments, the lens driving mechanism further comprises a magnetic field sensing element for sensing a change in a magnetic field of the magnetic element, and the circuit board assembly further has a circuit structure electrically connected to the circuit layer and electrically isolated from the driving coil, wherein the magnetic field sensing element is disposed on the bottom surface of the circuit board assembly and electrically connected to the circuit structure. The circuit board assembly further has a plurality of conductive portions exposed on the bottom surface of the circuit board assembly and electrically connected to the magnetic field sensing element and the circuit layer of the base module. The circuit board assembly further has a plurality of electrical connections exposed on a bottom surface of the circuit board assembly and electrically connected to the driving coil and the circuit layer of the base module. The circuit board assembly includes a main board and an extending portion, wherein the extending portion is disposed on the bottom surface of the main board, and the elastic member passes through the extending portion and is connected to the bottom surface of the extending portion.

BRIEF DESCRIPTION OF DRAWINGS

The invention can be more fully understood by reading the subsequent detailed description and examples with references made to the accompanying drawings, wherein.

DETAILED DESCRIPTION OF INVENTION

The making and using of the embodiments of the optical systems are discussed in detail below. It should be appreciated, however, that the embodiments provide many applicable inventive concepts that can be embodied in a wide variety of specific contexts. The specific embodiments discussed are merely illustrative of specific ways to make and use the embodiments, and do not limit the scope of the disclosure.

Unless defined otherwise, all technical and scientific terms used herein have the same meaning as commonly understood to one of ordinary skill in the art to which this invention belongs. It should be appreciated that each term, which is defined in a commonly used dictionary, should be interpreted as having a meaning conforming to the relative skills and the background or the context of the present disclosure, and should not be interpreted in an idealized or overly formal manner unless defined otherwise.

Figure 1:
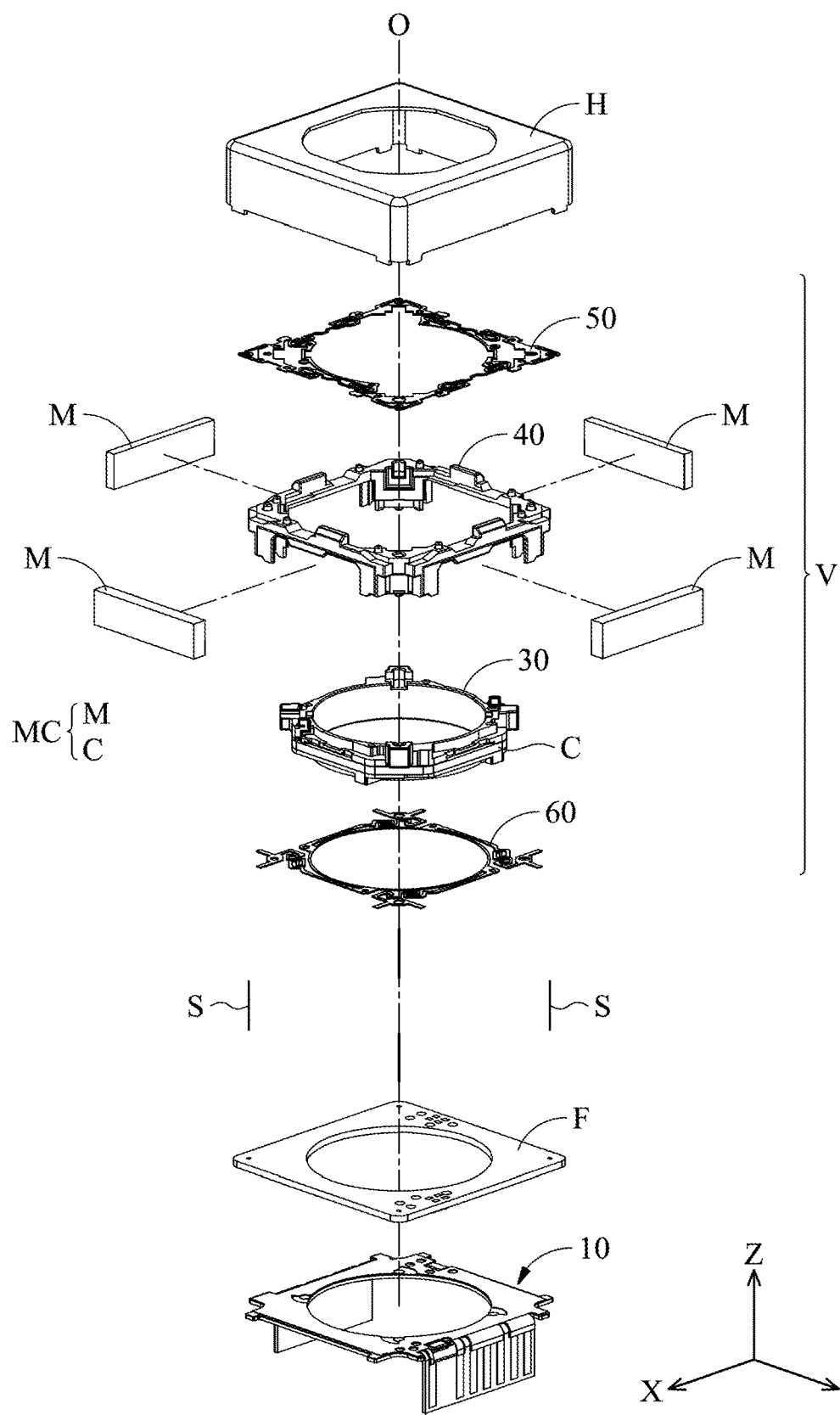
FIG. 1 is an exploded view diagram of a lens driving mechanism according to an embodiment of the present invention.
Figure 2:
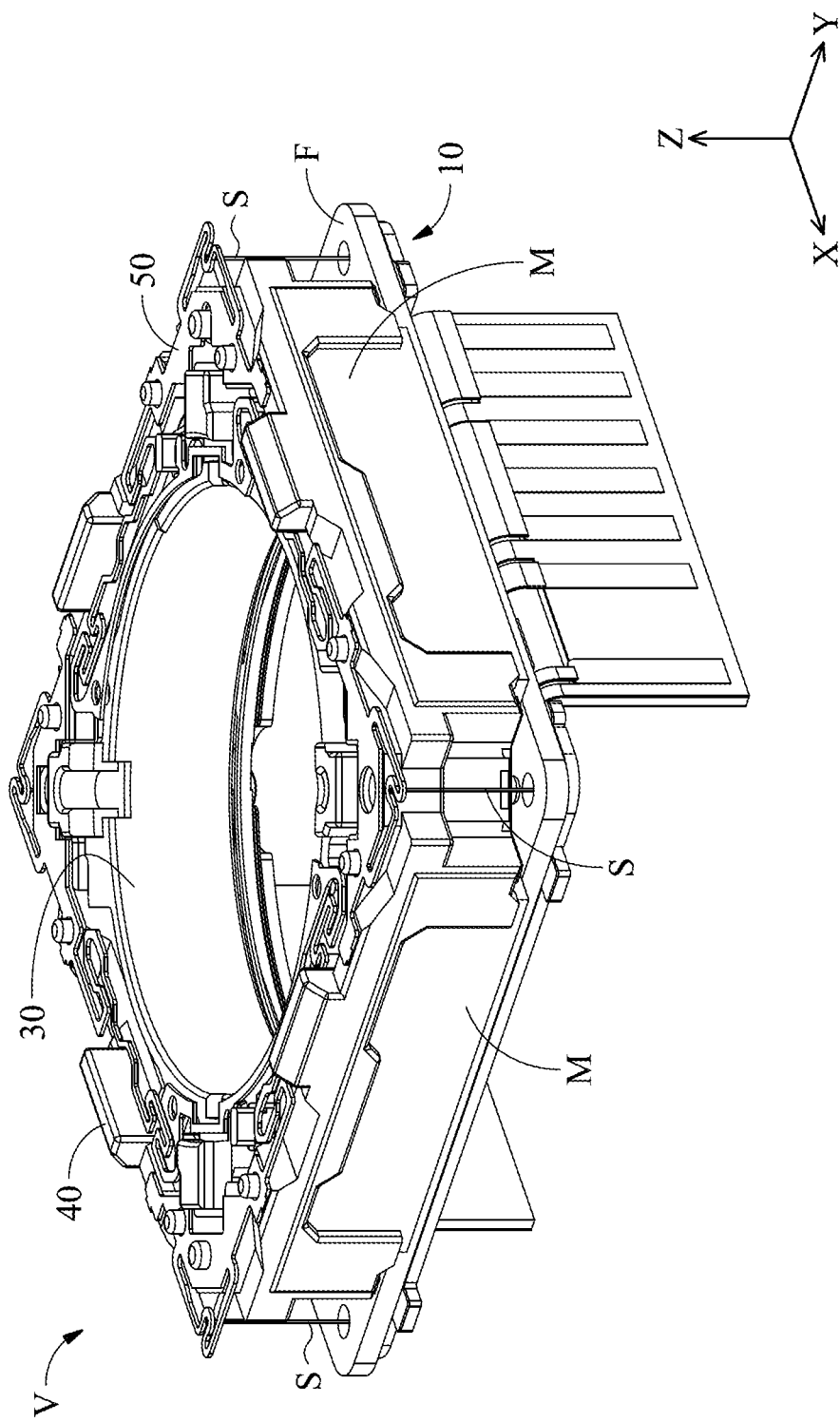
FIG. 2 is a schematic diagram of the lens driving mechanism in FIG. 1, wherein the metal housing is omitted.

Referring to FIGS. 1 and 2, FIG. 1 is an exploded view showing the optical driving mechanism 1 according to an embodiment of the present invention, and FIG. 2 is a schematic view showing the assembled optical driving mechanism 1 (the metal housing H is omitted). The optical driving mechanism 1 can be used, for example, to drive and sustain an optical element (such as a lens or a lens assembly), and can be disposed inside an electronic device (such as a camera, a tablet or a mobile phone). The optical driving mechanism 1 primarily comprises a metal housing H, a base module 10, a circuit board assembly F, a movable portion V and a plurality of elastic members S. The circuit board assembly F is disposed between the movable portion V and the base module 10, and the elastic members S are connected to the base module 10, the circuit board assembly F and the movable portion V. The metal housing H is connected to the base module 10 to form a receiving space for receiving the circuit board assembly F, the movable portion V and the elastic members S, to protect them. The movable portion V includes a holder 30 configured to sustain an optical element (for example, an optical lens or an optical lens assembly). When light (incident light) from the outside enters the optical driving mechanism 1, the light passes through the optical element disposed in the holder 30 along the optical axis O of the optical element and then to an image sensor disposed in the electronic device (not shown, for example, disposed at the bottom of the base module 10), to acquire an image. The structure of the movable portion V of the optical driving mechanism 1 will be described below.

Please still refer to FIGS. 1 and 2, the movable portion V includes the aforementioned holder 30, a frame 40, an upper leaf spring 50, a lower leaf spring 60, a plurality of magnetic elements (such as magnets) M and a coil C. The frame 40 is disposed outside the holder 30. The holder 30 is configured to sustain the optical component. The coil C is disposed around the holder 30. The magnetic elements M are disposed on the frame 40 and arranged around the holder 30 to face the coil C. The upper and lower leaf springs 50 and 60 are movably connected to the holder 30 and the frame 40 such that the holder 30 is movable relative to the frame 40.

The coil C and the magnetic elements M are corresponding and they can constitute a driving element MC. When a appreciate driving signal (for example, a driving current) is applied to the coil C by an external power source (not shown), a magnetic force is generated between the coil C and the magnetic elements M to drive the holder 30 to move relative to the frame 40 for the purpose of focusing or optical shaking compensation. In addition, the upper and lower leaf springs 50 and 60 keep the holder 30 in an initial position relative to the frame 40 prior to application of the driving signal. The driving component MC in this embodiment is a moving-coil type, but in other embodiments, it can be a moving-magnetic type.

The connection arrangement of the movable portion V, the circuit board assembly F, the elastic member S, and the base module 10 will be described below.

The circuit board assembly F is disposed on the base module 10 and connected to each other, and is movably connected to the upper leaf spring 50 of the movable portion V by a plurality of elongated elastic members S (for example, suspension wires). It should be noted that the optical driving mechanism 1 in this embodiment has four elastic members S. In other embodiments, an elastic member S may be used together with a suitable guiding mechanism (such as a slide rail) in another optical driving mechanism, or an optical driving mechanism has other quantities of (for example two or three) elastic members S. The circuit board assembly F has a driving coil DC (for example, a plate coil), which can correspond to and be coupled to the magnetic elements M in the movable portion V. The driving coil DC and the magnetic elements M can form an electromagnetic driving assembly MD. Similarly to a driving signal applied to the coil C so that the magnetic force is generated between the coil and the magnetic elements M to force the holder 30 to move, the driving coil DC can generate a magnetic force with the magnetic elements M, thereby driving the movable portion V to move relative to the base module 10 and the circuit board assembly F (for example, displacement in the XY plane), to achieve optical compensation and shockproofing.

The structure of the base module 10 and its configuration with the circuit board assembly F and the elastic member S is described in detail below.

Figure 3A:
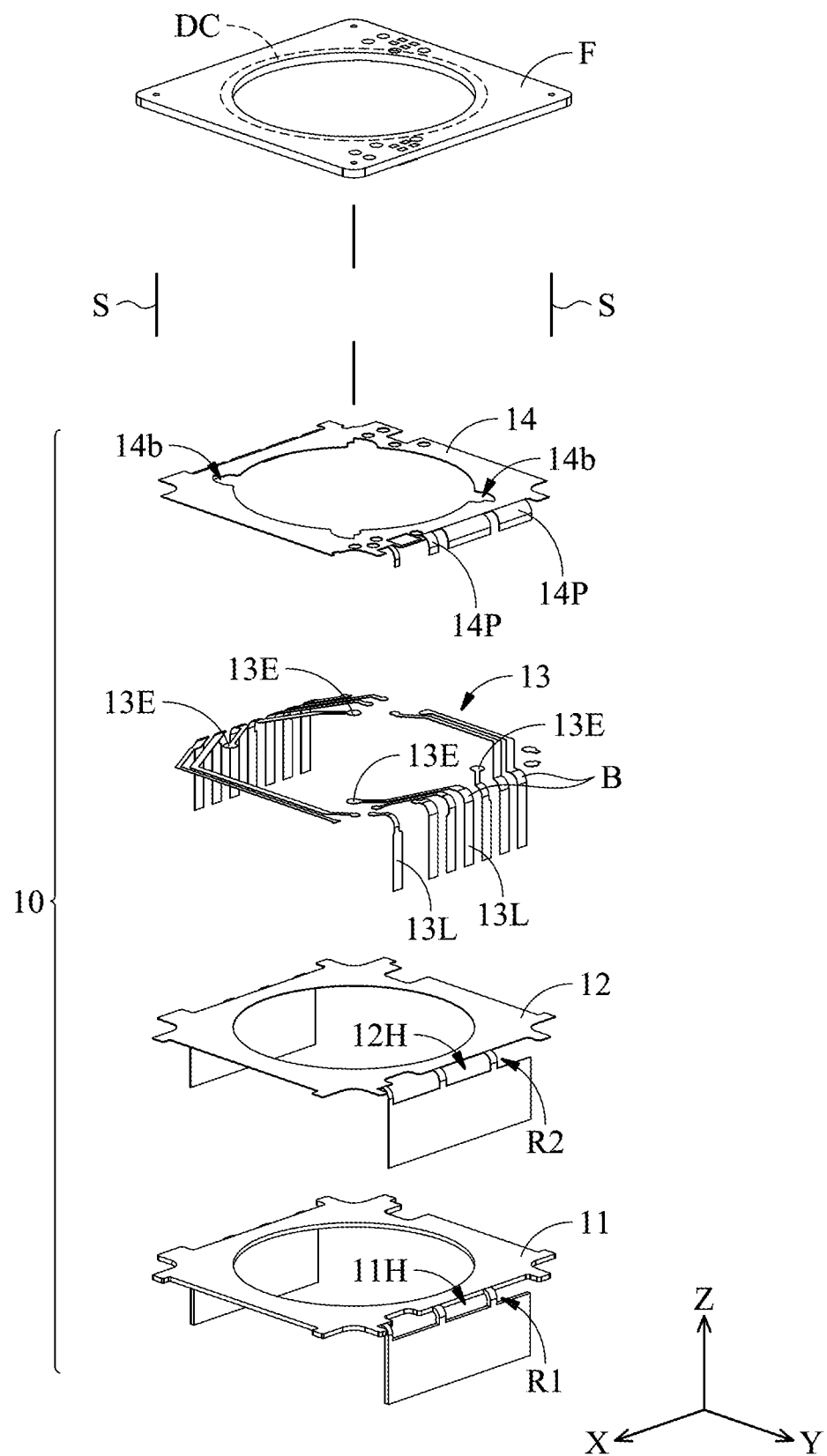
FIG. 3A is a schematic diagram of the base module, the circuit board assembly and the elastic member in FIG. 1.
Figure 3B:
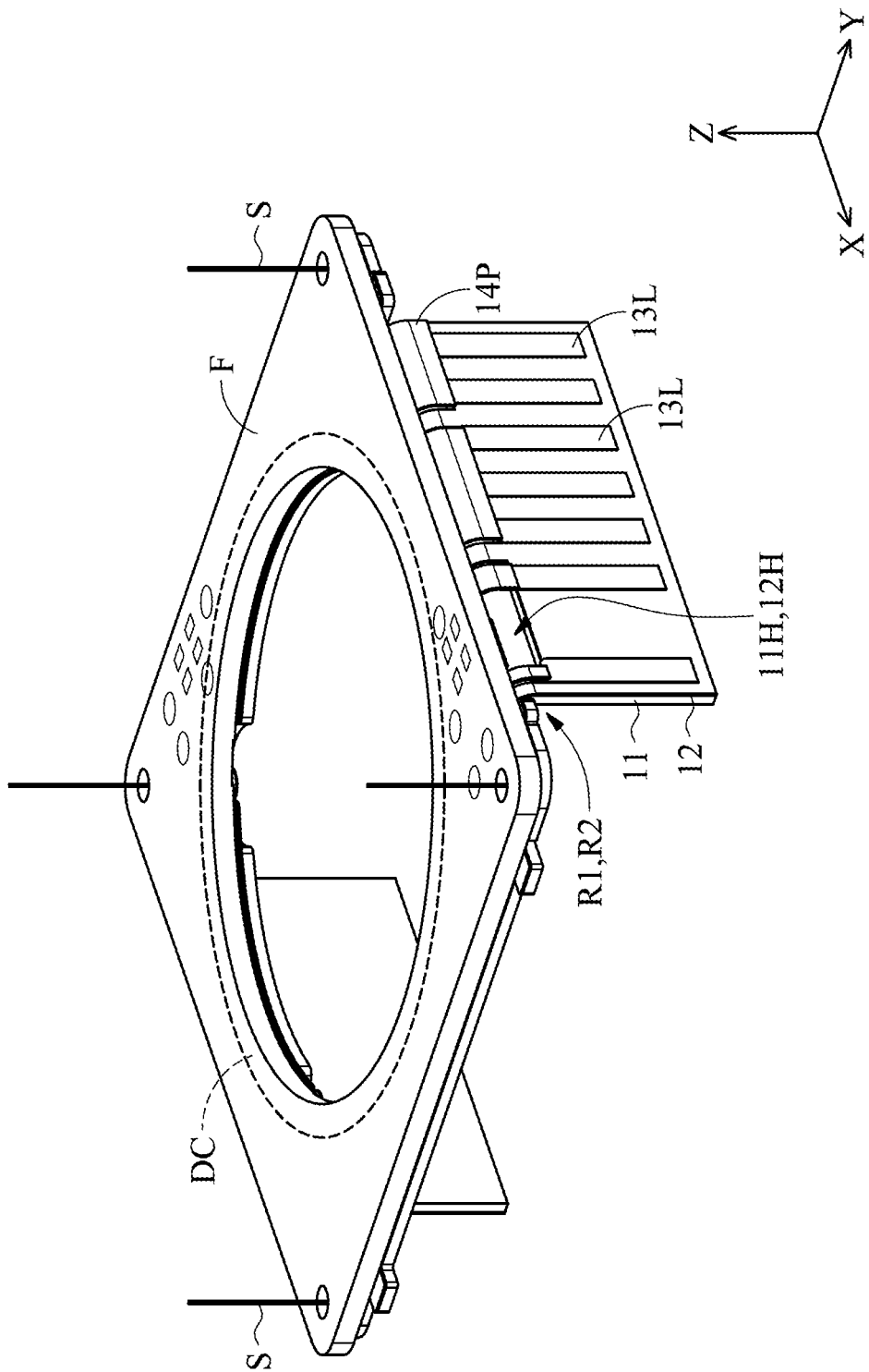
FIG. 3B is a schematic diagram of the base module, the circuit board assembly and the elastic member in FIG. 1 after assembly.

As shown in FIGS. 3A-3B, the base module 10 has a metal substrate 11, an insulating layer 12, a circuit layer 13 and a protective layer 14, wherein the insulating layer 12 is disposed between the metal substrate 11 and the circuit layer 13. The circuit layer 13 is disposed between the insulating layer 12 and the protective layer 14, and the insulating layer 12 and the protective layer 14 are configured to protect the circuit layer 13. The insulating layer 12 can be used to block the circuit layer 13 from being electrically connected to the metal substrate 11 (the metal substrate 11 is below the circuit layer 13 in Z-axis direction) to avoid short circuit, and the protective layer 14 can also include an insulating material to prevent the circuit in other mechanisms or the circuit board assembly F (above the protective layer 14 in Z-axis direction) is electrically conductive with the metal substrate 11 to cause a short circuit problem. In this embodiment, in the direction of an optical axis O of the optical element, the insulating layer 12 is closer to the metal substrate 11 than the protective layer 14, and the thermal conductivity of the protective layer 14 is lower than the thermal conductivity of the insulating layer 12, so that the heat of the integral optical driving mechanism 1 (for example, thermal energy generated by the electronic components) is easily dissipated through the lower half of the base module 10, to enhance heat dissipation.

It should be noted that a plurality of openings 11H are formed on a bent portion R1 of the metal substrate 11, and a plurality of openings 12H are formed on a bent portion R2 of the insulating layer 12. When the insulating layer 12 is placed on the metal substrate 11, the openings 11H and 12H overlap each other to form a hollow structure. The wires 13L of the circuit layer 13 extend across (or extend over or extend through) a portion of the openings 11H and 12H, that is, the wires 13L partially cover the openings 11H and 12H, and a bridge portion B is formed on the bent portions R1 and R2. A protruding portion 14P of the protective layer 14 also extends over (or through) the openings 11H and 12H and covers the bridging portion B on the openings 11H and 12H, and the protruding portion 14P does not cover the bent bodies (physical parts) of the bent portions R1 and R2. Similarly, the bridge portion B also does not cover the bent bodies (physical parts) of the bent portions R1, R2. In this way, when the metal substrate 11, the insulating layer 12, the circuit layer 13 and the protective layer 14 are stacked, the overall thickness thereof can be greatly reduced, and the bent portion is less likely to be broken or deformed by the impact of an external force. Therefore, the reliability of the optical driving mechanism 1 is improved.

Figure 3C:
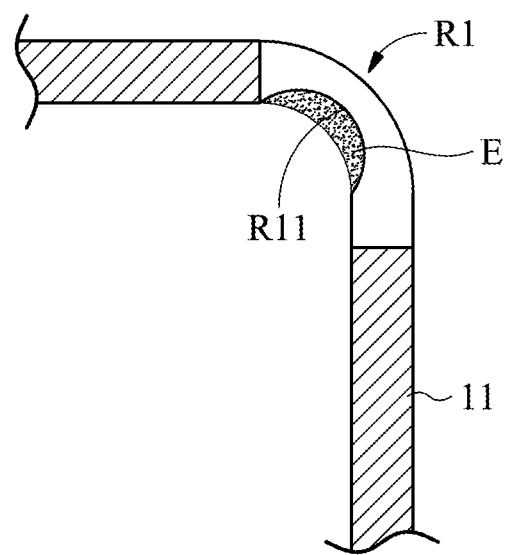
FIG. 3C is a schematic diagram of the bent portion of the metal substrate in FIG. 1 having a recess where a glue disposed therein.

In some embodiments, as shown in FIG. 3C, a groove R11 is formed on an inner surface of one the bent portion R1 of the metal substrate 11. In the manufacturing process of the metal substrate 11, the groove R11 is provided to facilitate the bending of the metal substrate 11 from the planar substrate into a substrate having an L-shaped structure, thereby improving process efficiency. Further, a glue (or an adhesive colloid) E may be provided in the groove R11, and the glue E reinforces the strength of the thin thickness of the bent portion R1 having the groove R11, thereby improving the mechanical strength and making the region more elastic.

Figure 3D:
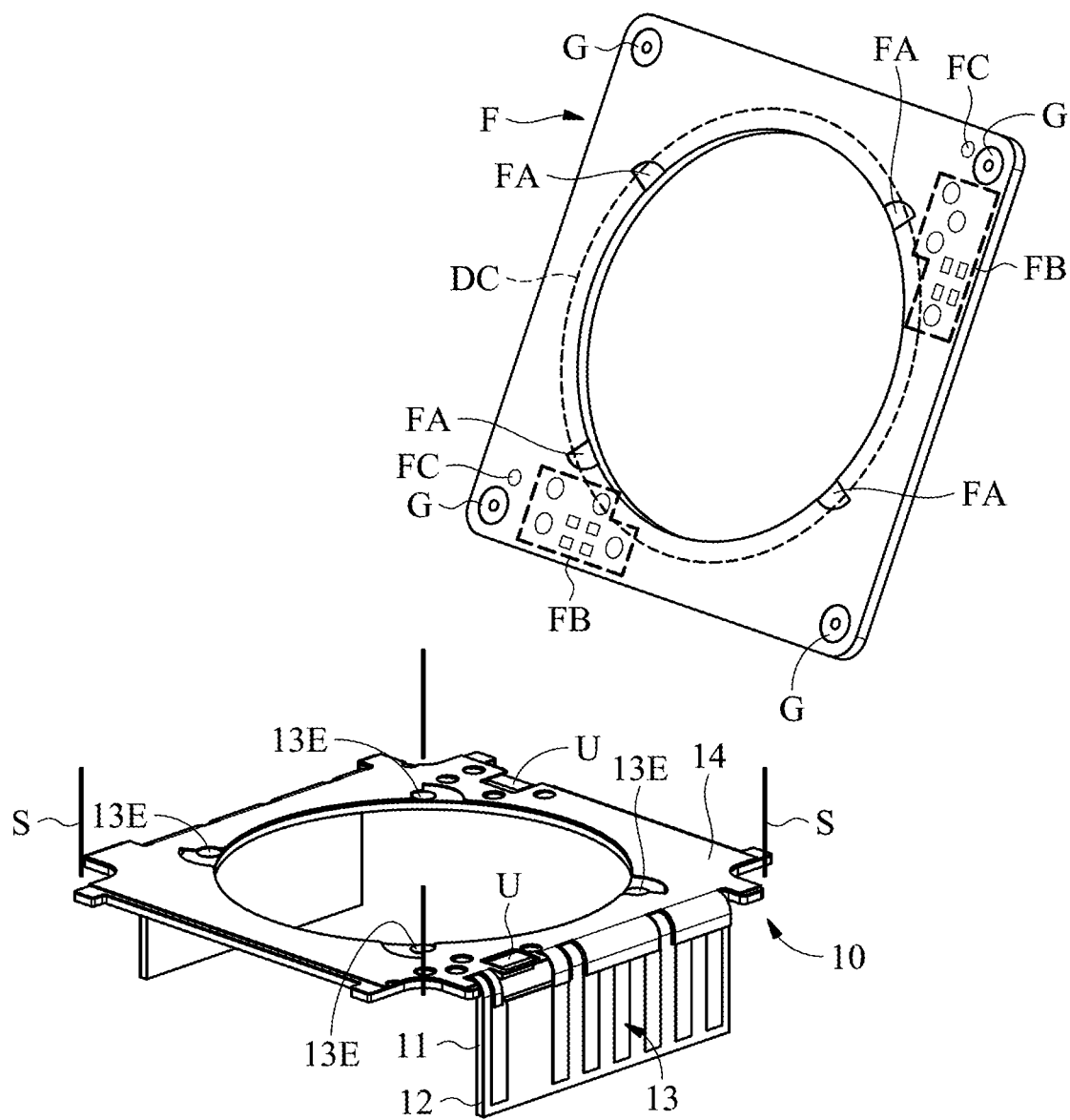
FIG. 3D is a schematic diagram of the base module and the circuit board assembly in FIG. 1 being separated.

FIG. 3D is a schematic diagram showing the separation of the circuit board assembly F from the base module 10. A plurality of electrical connections FA, a plurality of conductive portions FB, and a plurality of circuit structures FC are formed on the bottom surface F101 of the circuit board assembly F. It should be noted that the electrical connections FA, the conductive portions FB and the circuit structures FC in the circuit board assembly F are electrically isolated from each other and electrically connected to the circuit layer 13.

Referring to the aforementioned electrical connections FA, they are exposed on the bottom surface F101 of the circuit board assembly F and are a part of the driving coil DC, and the driving coil DC is also electrically isolated from the conductive portions FB and the circuit structures FC. It should be noted that the foregoing protective layer 14 has a plurality of openings 14b exposing the electrical contacts 13E of the circuit layer 13 to be electrically connected to the electrical connections FA of the driving coil DC of the circuit board assembly F, wherein the area of each opening 14b is larger than the area of the electrical contact 13E exposed by the opening 14b. This facilitates the process personnel to check the connection between the circuit board assembly F and the circuit layer 13 to improve the reliability of the overall mechanism.

Continuing to refer to FIG. 3D, the optical driving mechanism 1 further comprises a magnetic field sensing element U for sensing the magnetic field change of the magnetic element M (FIG. 1) in the movable portion V, which is disposed on the circuit board assembly F. Specifically, in the embodiment, the magnetic field sensing element U is disposed on the bottom surface F101 of the circuit board assembly F and electrically connected to the conductive portion FB. The magnetic field sensing element U can be a Hall effect sensor, the magnetic element M can be a permanent magnet, and the Hall effect sensor can determine the position of the permanent magnet by detecting the magnetic field change of the permanent magnet, thereby detecting the movement of the holder 30 and the optical element disposed therein of the movable portion V relative to the base module 10 due to vibration. In another embodiment, the magnetic field sensing element U can also use other types of sensing elements, such as a magnetoresistive sensor (MRS) or an optical sensor, to sense the relative positions between the movable portion V and the circuit board assembly F and the base module 10.

Figure 4A:
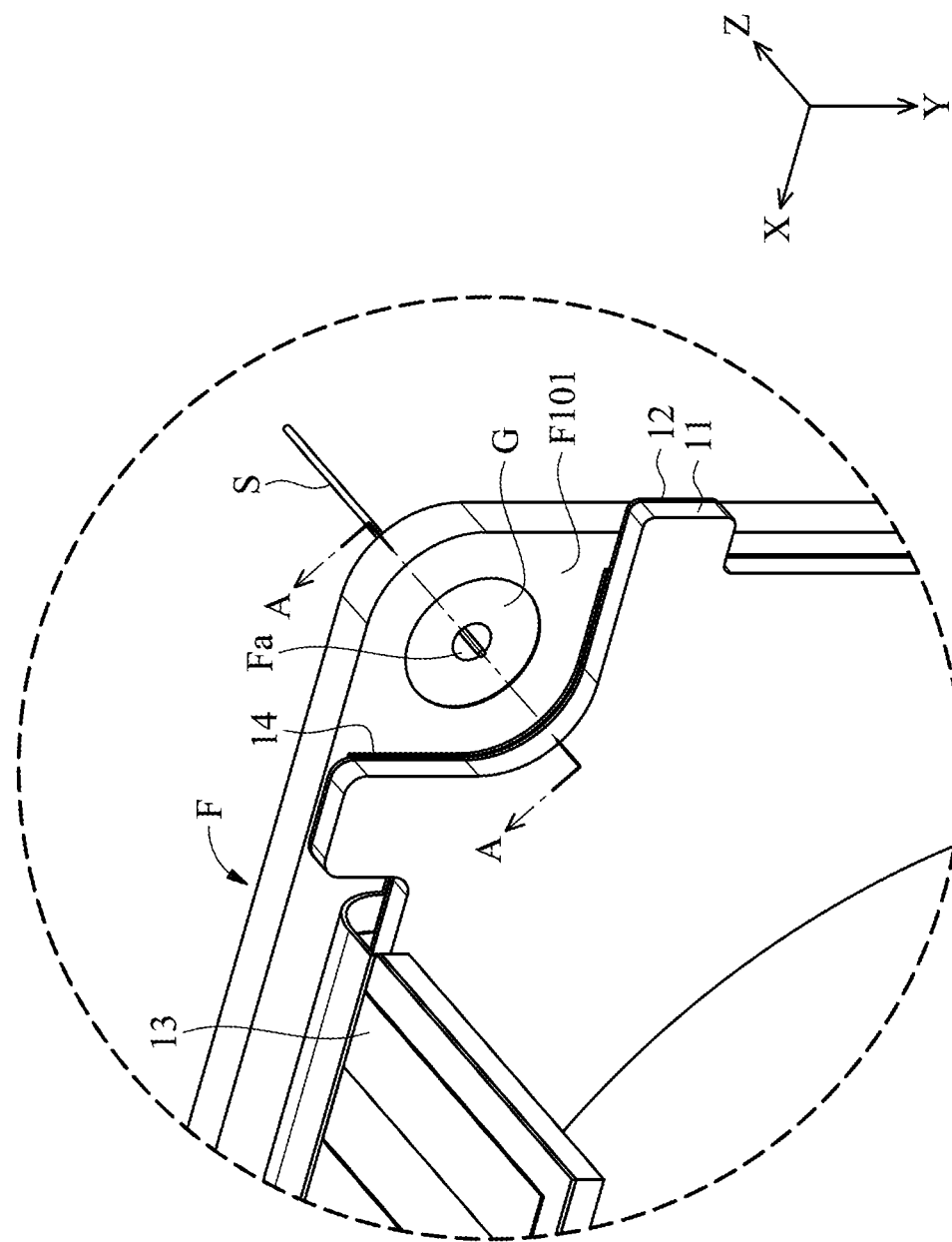
FIG. 4A is a schematic diagram of the connection of one elastic member between the circuit board assembly and the base module in FIG. 3B.
Figure 4B:
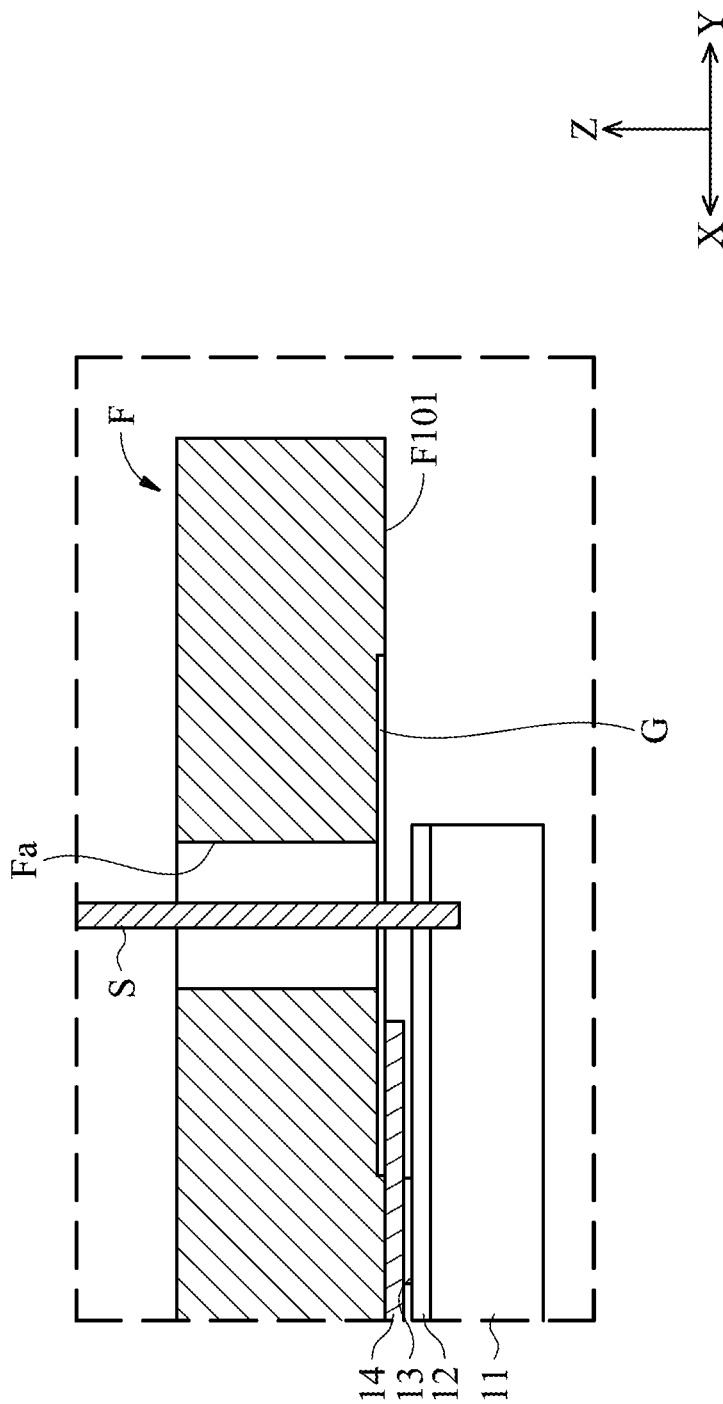
FIG. 4B is a cross-sectional view taken along the line A-A in FIG. 4A.

Please refer to 3B and 4A-4B. FIG. 4A shows a schematic diagram of an elastic member S in FIG. 3B connected to the circuit board assembly F and the base module 10. FIG. 4B shows a cross-sectional view of line A-A in FIG. 4A. The circuit board assembly F has a plurality of through holes Fa located at the corners of the circuit board assembly F and corresponding to the plurality of the elastic members S. As can be seen from the FIGS. 4A-4B, one elastic member S passes through one through hole Fa of the circuit board assembly F and is electrically connected to an electrical connecting element G affixed to the bottom surface F101 of the circuit board assembly F. In the present embodiment, the elastic member S passes through and is welded to the electrical connecting element G having a hollow structure.

More specifically, the elastic member S is welded to the bottom of the electrical connecting element G. The electrical connecting element G is electrically connected to the circuit structure FC and is electrically connected to the circuit layer 13 via the circuit structure FC. In this way, the elastic member S can be electrically connected to the circuit layer 13 of the base module 10 via electrical connecting element G and the internal circuit (circuit structure FC) of the circuit board assembly F, and the movable portion V can be electrically connected to the outside of the mechanism (for example, a driving power source) via the elastic member S and the circuit layer 13. Therefore, with this configuration, the number of wires can be reduced, thereby simplifying the circuit setting and the processing cost, and the volume of the overall driving mechanism can also be smaller to achieve miniaturization. Furthermore, in the present embodiment, in the direction of the optical axis O (Z-axis) of the optical element, the aforementioned circuit structure FC and the driving coil DC are situated in different positions in the circuit board assembly F, in other words, the circuit structure FC and the drive coils DC do not overlap in the direction of the vertical optical axis O, which reduces the overall thickness of the circuit board assembly F in the Z-axis direction.

Figure 5:
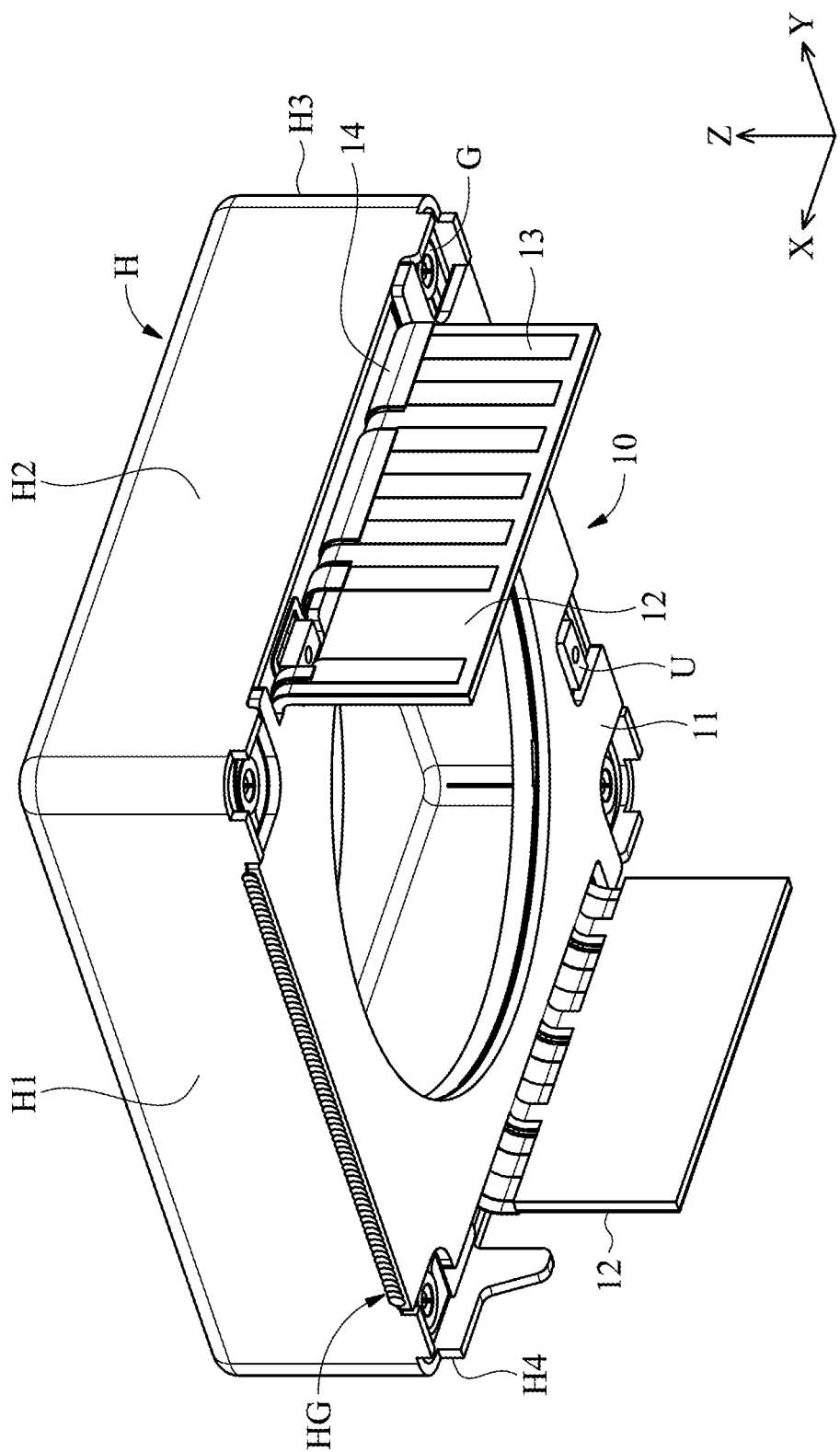
FIG. 5 is a schematic diagram of the assembly of the metal housing and the base module in FIG. 1.

FIG. 5 is a schematic view showing the assembly of the metal housing H and the base module 10. In the present embodiment, the metal housing H has a metal material and is connected to the metal substrate 11 of the base module 10, wherein the connection manner of the two includes welding and adhesion. As shown in FIG. 5, the side H1 of the metal housing H is a side where the circuit layer 13 of the base module 10 is not exposed. The side H1 is soldered to the metal substrate 11, and in detail, they are welding in a T.I.G welding manner (the T.I.G welding area HG, as shown in FIG. 5), it can greatly improve the sealing degree of the overall mechanism. The other side H3 can also be welded using a T.I.G welding. In some embodiments, the sides H1 and H3 of the metal housing H may be joined to the metal substrate 11 using laser welding. On the side of the circuit layer 13 exposing the base module 10, that is, the sides H2 and H4 of the metal housing H, the metal housing H and the metal substrate 11 are connected by means of adhesive bonding, wherein the adhesive material can be, for example, a resin. In this way, the metal housing H forms a closed joint surface with the metal substrate 11 of the base module 10, and the circumferential sealing can avoid or reduce the entry of dust and particles outside the optical driving mechanism 1 and enhance the overall mechanism.

Figure 6:
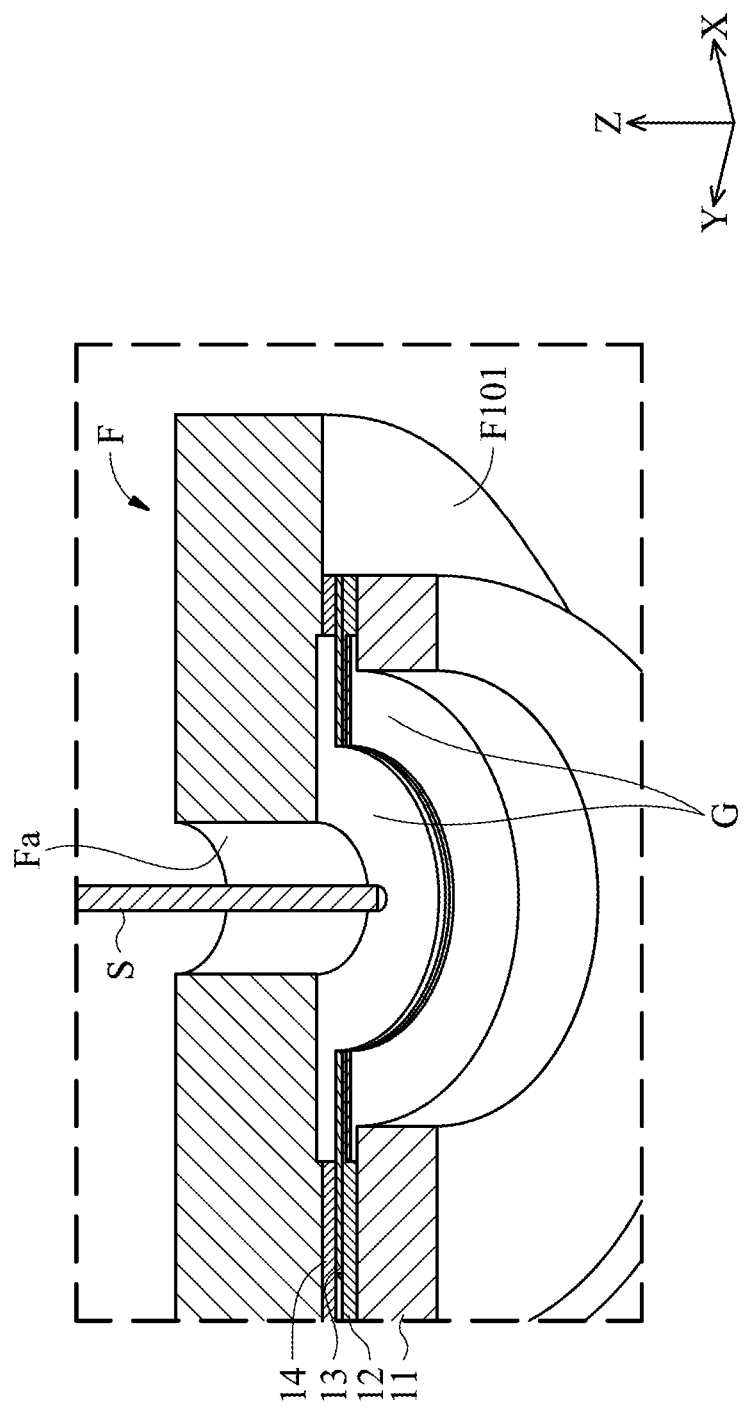
FIG. 6 is a schematic diagram of an elastic member corresponding to a plurality of electrical connecting elements according to another embodiment of the present invention.

In another embodiment, as shown in FIG. 6, the optical driving mechanism 1 comprises a plurality of electrical connecting elements G, and each of the elastic members S corresponds to two electrical connection elements G. In particular, the two electrical connecting elements G are respectively disposed on the bottom surface F101 of the circuit board assembly F and the bottom surface of the insulating layer 12 of the base module 10, and are connected (for example, soldered) to the elastic member S. In this way, each elastic member S is connected to the circuit board assembly F and the base module 10 via a plurality of connecting mechanisms (i.e., the electric connecting elements G), so that the elastic member S is less likely to fall off and the connection strength is enhanced.

Figure 7A:
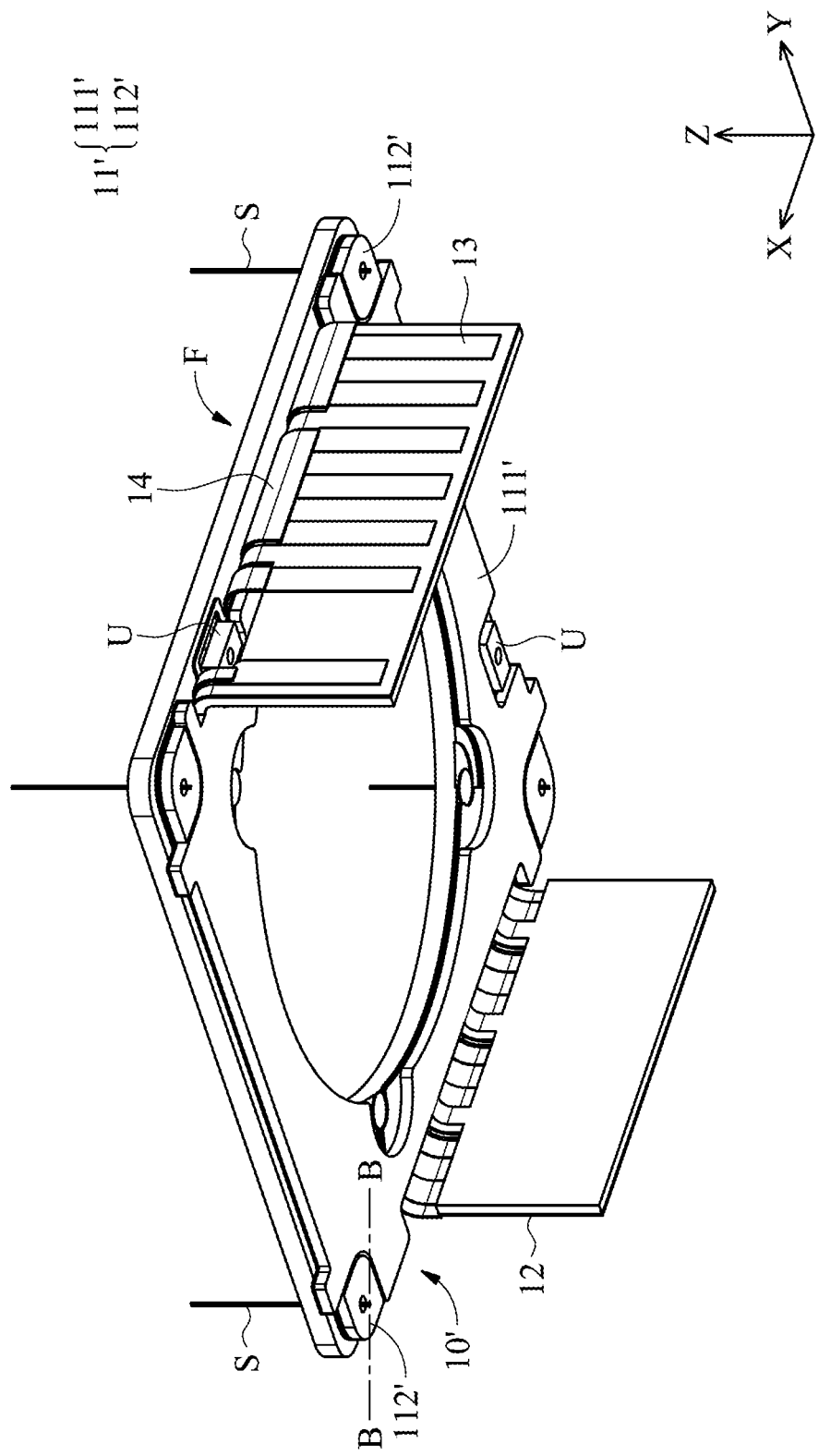
FIG. 7A is a schematic diagram of the connection of the base module between the elastic member and the circuit board assembly according to another embodiment of the present invention.
Figure 7B:
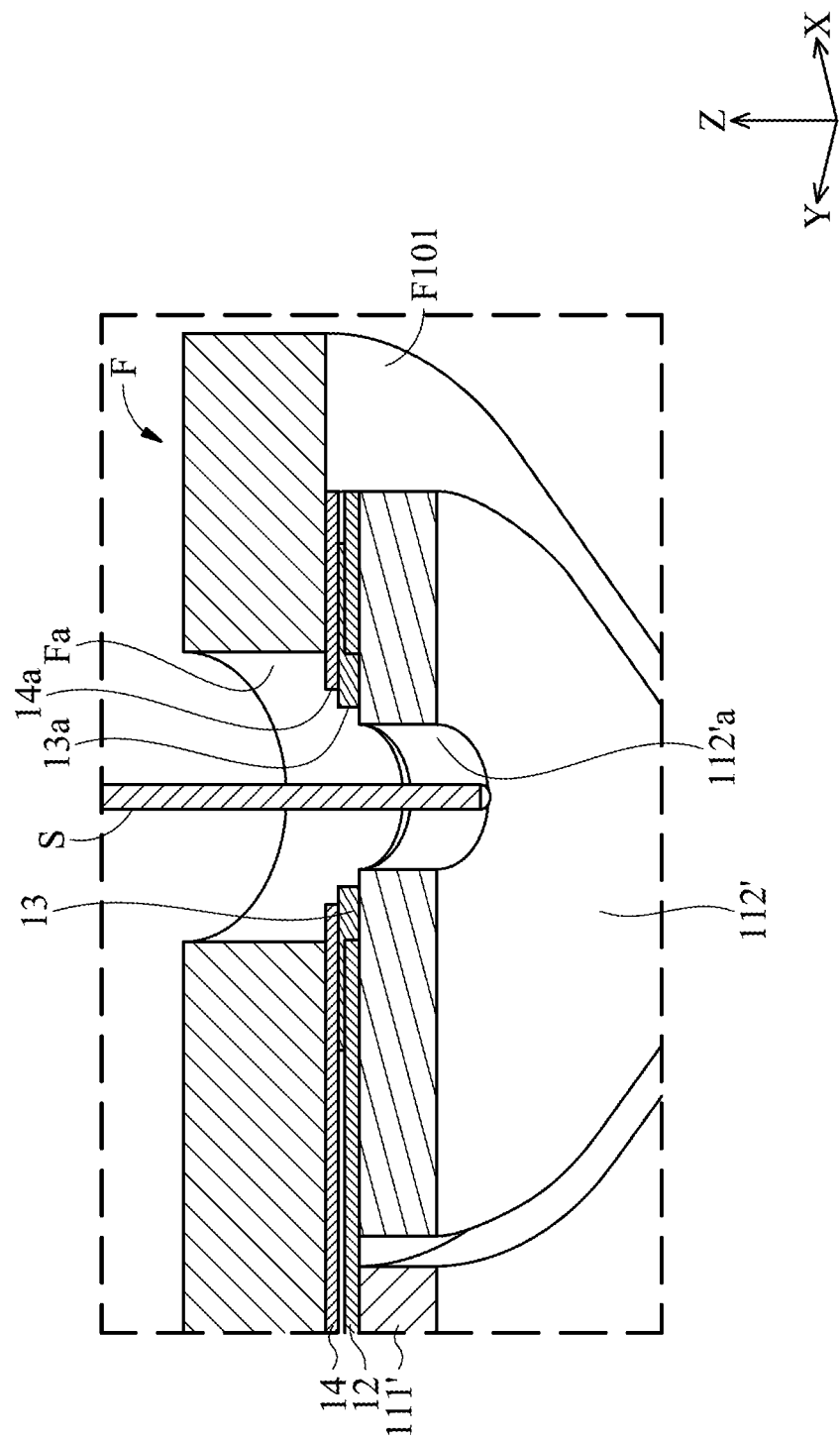
FIG. 7B is a cross-sectional view taken along the line B-B in FIG. 7A.

FIGS. 7A-7B are schematic views showing the connection of another base module 10' and the circuit board assembly F of the present invention. The main difference between the base module 10' of this embodiment and the base module 10 in FIG. 4A is that the metal substrate 11' of the base module 10' can define a main body 111' and a plurality of connection pieces 112'. A gap is formed between each of the connection pieces 112' and the main body 111', and they are separated from each other, wherein both the main body 111' and the connection piece 112' include a metal material.

Specifically, the connection pieces 112' are located substantially at the corners of the circuit board assembly F, disposed around the main body 111', and electrically isolated from the main body 111'. The elastic member S is extending or passing through the through hole 112'a of the connection piece 112' and electrically connected to the bottom surface of the connection piece 112' (for example, by soldered method), and the connection piece 112' and the circuit layer 13 is electrically connected. Via the sequential path of the electrical connection: the elastic member S, the connection piece 112' and the circuit layer 13, the elastic member S can be electrically connected to an external element or an unit (for example, a driving power source). In such an arrangement, the elastic member S can extend to the bottom surface of the metal substrate 10' in the optical axis direction (Z-axis). Compared with the configuration in FIG. 1, the elastic member S in this embodiment, the length thereof can be designed to be longer due to the end being extended to the bottom surface of the connection piece 112', so that the moving space for the movable portion V (located above the base module 10') by the driving of the elastic member S is larger, thereby improving the optical shaking compensation. Alternately, the total length of the elastic member S is constant, so that the overall height (or thickness) of the optical driving mechanism 1 in the optical axis O (Z-axis) direction can be lower to achieve miniaturization.

It should be noted that the sequence of the elastic member S passing through in the bottom-up direction (i.e., the +Z-axis direction) of the optical axis O is: the through hole 112'a of the connection piece 112', the through hole 13a of the circuit layer 13, the through hole 14a of the protective layer 14 and the through hole Fa of the circuit board assembly F. As can be seen from the 7B, those through holes (112'a, 13a, 14a and Fa) where the elastic member S passed through is larger and larger from the top to the bottom, in other words, the aforementioned through holes that the elastic member S passes through are arranged in a small to large arrangement: through holes 112'a, 13a, 14a, to Fa. As a result, the hole closer to the movable portion V is larger, and the problem of collision interference when the elastic member S moves the movable portion V can be reduced or avoided, thereby improving the damage of the part or the generation of debris due to impact.

Figure 8A:
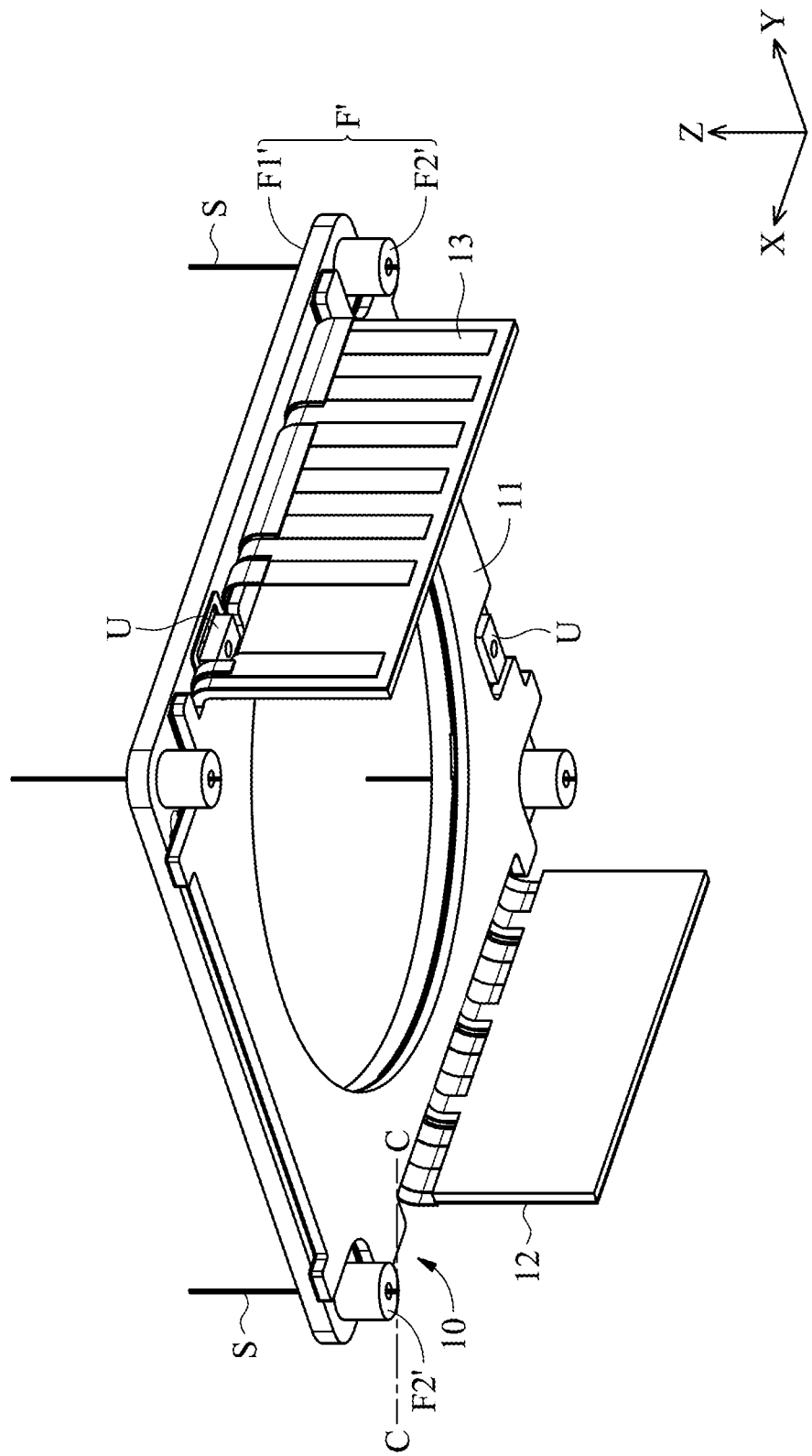
FIG. 8A is a schematic diagram of the connection between the circuit board assembly and the base module according to another embodiment of the present invention.
Figure 8B:
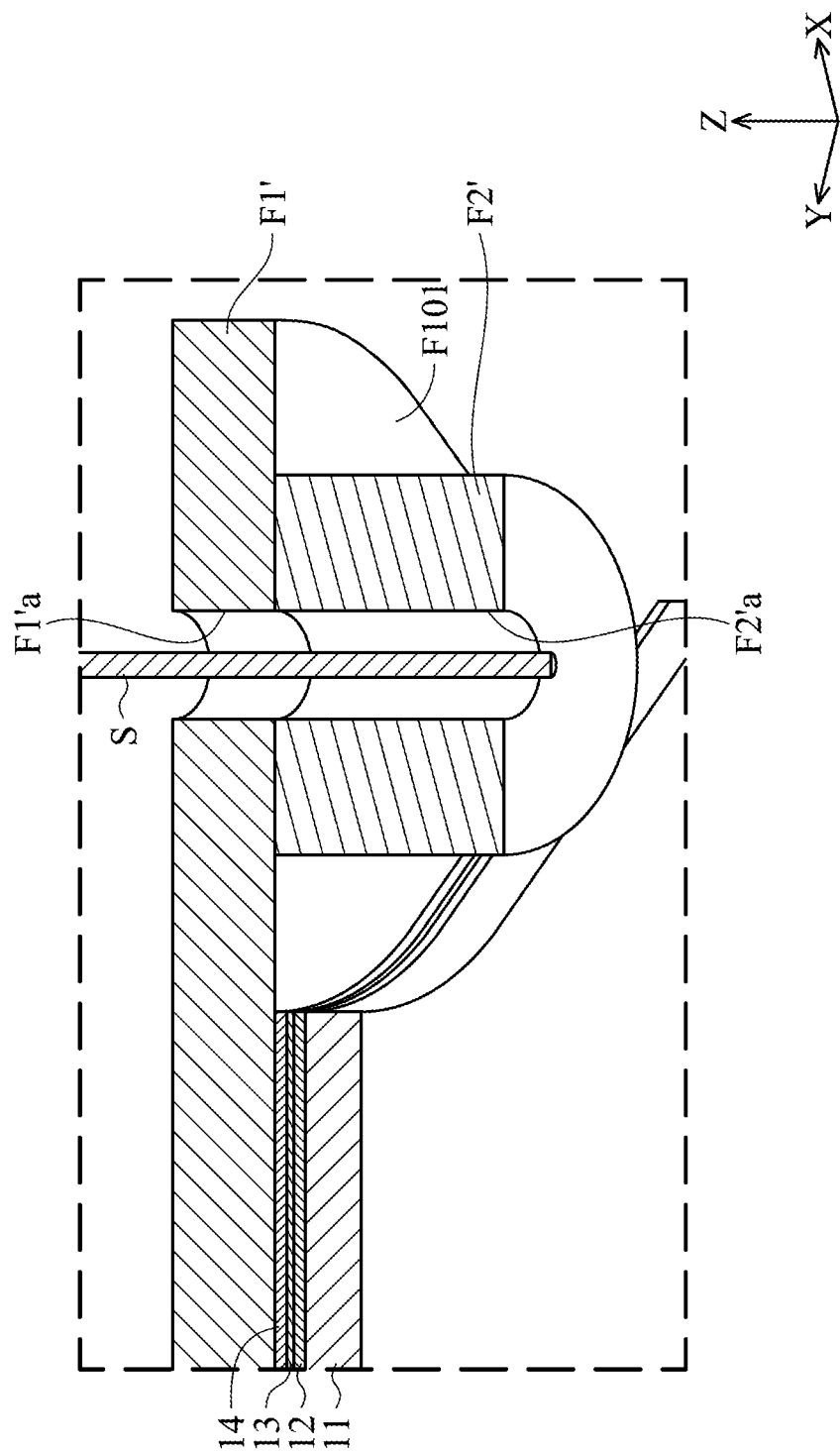
FIG. 8B is a cross-sectional view taken along line C-C in FIG. 8A.

FIG. 8A is a schematic view showing the connection of the circuit board assembly F' to the base module 10 of the other embodiment of the present invention; and FIG. 8B is a cross-sectional view taken along line C-C of FIG. 8A. The main difference between the circuit board assembly F' in this embodiment and the circuit board assembly F in FIG. 4A is that the circuit board assembly F' can define a main board F1' and a plurality of extending portions F2'. In detail, the extending portions F2' are disposed on the bottom surface of the main board F1', and they are respectively located at the corners of the main board F1' corresponding to the elastic members S and including a metal material. The inner portions of the main board F1' and the extending portion F2' also have through holes F1'a and F2'a, respectively, which correspond to each other, and the elastic member S passes through the through holes F1'a, F2'a and is disposed to the bottom surface of the extending portion F2', wherein the elastic member S is welded and electrically connected to the bottom surface of the extending portion FT. In such a configuration, the path sequence of the movable portion V electrically connected to an external element of the optical driving mechanism 1 is: the movable portion V, the elastic member S, the extending portion F2', the driving coil DC in the main board F1', and the circuit layer 13 to the external element. By extending the portion F2', the end of the elastic member S can be similarly extended to the bottom surface of the extending portion F2', so that the length thereof is designed to be longer, and the moving space of the movable portion V driven by the elastic member S is larger, which enhances the effect of optical compensation; or, the total length of the elastic member S is constant (compared to the embodiment of FIG. 4A), so that the overall height or thickness of the optical driving mechanism 1 can be reduced in the optical axis O (Z-axis) direction for miniaturization purposes.

In summary, the present invention provides a lens driving mechanism, configured to drive an optical element, including a holder, a circuit board assembly, a base module, and a magnetic element. The optical element is disposed on a holder, and the circuit board assembly has a driving coil. The base module has a metal substrate, an insulating layer, a circuit layer electrically connected with the driving coil, and a protective layer. The insulating layer is disposed between the metal substrate and the circuit layer, and the circuit layer is disposed between the insulating layer and the protective layer. The metal substrate has a bent portion, and an opening is formed on the bent portion. A wire of the circuit layer extends across the opening and forms a bridging portion. The protective layer has a protruding portion which extends over the opening and covers the bridging portion. The magnetic element is coupled to the driving coil. The magnetic element and the driving coil are configured to drive the holder and the optical element to move relative to the base module. Therefore, the bridge portion is formed by the wire in the circuit layer extending through (or over) the opening of the bent portion of the metal substrate, and the protruding portion of the protective layer covers the bridge portion, and the bridge portion and the protruding portion do not cover the bent portion, thereby not only strengthening the circuit layer, but also avoiding or reducing the situation of the bent portion being broken or deformed due to impact by an external force based on the bent portion being stronger. Furthermore, the thickness of the base module can be reduced, so that the overall volume of the optical driving mechanism can be decreased to achieve miniaturization.

In addition, in some embodiments, at least one electrical connection, one conductive portion and one circuit structure is disposed inside the circuit board assembly, and the three are electrically separated and independent, and are respectively connected to the driving coil, the magnetic field sensing element and at least one elastic member which is connected the holder and the circuit board assembly. In this way, those circuit units are disposed in the circuit board assembly having the driving coil, and the volume of the optical driving mechanism can be further reduced, and the mechanical strength can be enhanced by setting the circuit units, and the magnetic field distribution of the magnetic element can be changed to increase the driving force. Moreover, the magnetic interference between magnetic elements and circuit components in other mechanisms can be also prevented.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

It will be apparent to those skilled in the art that various modifications and variations can be made in the invention. It is intended that the standard and examples be considered as exemplary only, with the true scope of the disclosed embodiments being indicated by the following claims and their equivalents.

What is claimed is:
1. A lens driving mechanism, configured to drive an optical element, comprising:
   a holder, wherein the optical element is disposed in the holder;
   a circuit board assembly, having a driving coil
   a base module, having a metal substrate, an insulating layer, a circuit layer electrically connected with the driving coil, and a protective layer, wherein the insulating layer is disposed between the metal substrate and the circuit layer, and the circuit layer is disposed between the insulating layer and the protective layer, wherein the metal substrate has a bent portion, an opening is formed on the bent portion, a wire of the circuit layer extends across the opening and forms a bridging portion, and the protective layer has a protruding portion which extends over the opening and covers the bridging portion; and
   a magnetic element, coupled to the driving coil, wherein the magnetic element and the driving coil are configured to drive the holder and the optical element to move relative to the base module.

2. The lens driving mechanism as claimed in claim 1, wherein the bent portion of the metal substrate is not covered by the bridging portion of the circuit layer and the protruding portion of the protective layer.

3. The lens driving mechanism as claimed in claim 1, wherein an inner surface of the bent portion has a recess.

4. The lens driving mechanism as claimed in claim 3, wherein the base module further has a glue disposed in the recess.

5. The lens driving mechanism as claimed in claim 1, wherein in the direction of an optical axis of the optical element, the insulating layer is closer to the metal substrate than the protective layer, and the thermal conductivity of the protective layer is lower than the thermal conductivity of the insulating layer.

6. The lens driving mechanism as claimed in claim 1, wherein the circuit layer has an electrical contact exposed to an opening of the protective layer and electrically connected to the circuit board assembly, and the area of the opening is larger than the area of the electrical contact exposed by the opening.

7. The lens driving mechanism as claimed in claim 1, further comprising a metal housing, wherein the metal housing and the metal substrate are combined with each other by welding and adhesive, and the metal housing forms a closed joint surface with the metal substrate.

8. The lens driving mechanism as claimed in claim 1, further comprising an elastic member connecting the circuit board assembly and the holder, wherein the elastic member passes through the circuit board assembly and is soldered to the bottom surface of the circuit board assembly.

9. The lens driving mechanism as claimed in claim 8, wherein the circuit board assembly further has a circuit structure electrically isolated from the driving coil, and the elastic member is electrically connected to the circuit structure, and the circuit structure is electrically connected to the circuit layer of the base module.

10. The lens driving mechanism as claimed to claim 1, further comprising an elastic member connecting the base module and the holder, wherein the elastic member passes through the metal substrate and is soldered to the bottom surface of the metal substrate.

11. The lens driving mechanism as claimed in claim 10, wherein the metal substrate includes a main body and a connection piece, there is a gap between the main body and the connection piece, and the main body and the connection piece are electrically isolated from each other, wherein the elastic member passes through the connection piece and is soldered to the bottom surface of the connection piece.

12. The lens driving mechanism as claimed in claim 1, further comprising an elastic member and a hollow electrical connecting element, wherein the circuit board assembly further has a circuit structure electrically isolated from the driving coil, the elastic member connects the circuit board assembly and the holder, and the electrical connecting element is affixed to the bottom surface of the circuit board assembly and electrically connected to the circuit structure, wherein the elastic component passes through the electrical connecting element and is soldered to the bottom of the electrical connecting element.

13. The lens driving mechanism as claimed in claim 1, wherein the circuit board assembly further has a circuit structure electrically isolated from the driving coil and electrically connected to the circuit layer, wherein in the direction of the optical axis of the optical element, the circuit structure and the driving coil are located in different positions in the circuit board assembly.

14. The lens driving mechanism as claimed in claim 1, further comprising a magnetic field sensing element for sensing a change in a magnetic field of the magnetic element, and the circuit board assembly further has a circuit structure electrically connected to the circuit layer and electrically isolated from the driving coil, wherein the magnetic field sensing element is disposed on the bottom surface of the circuit board assembly and electrically connected to the circuit structure.

15. The lens driving mechanism as claimed in claim 14, wherein the circuit board assembly further has a plurality of conductive portions exposed on the bottom surface of the circuit board assembly and electrically connected to the magnetic field sensing element and the circuit layer of the base module.

16. The lens driving mechanism as claimed in claim 1, wherein the circuit board assembly further has a plurality of electrical connections exposed on a bottom surface of the circuit board assembly and electrically connected to the driving coil and the circuit layer of the base module.

17. The lens driving mechanism as claimed in claim 1, wherein the circuit board assembly includes a main board and an extending portion, wherein the extending portion is disposed on a bottom surface of the main board, and the elastic member passes through the extending portion and is connected to a bottom surface of the extending portion.

* * * * *